(12) United States Patent
Liu et al.

(10) Patent No.: US 8,927,359 B2
(45) Date of Patent: Jan. 6, 2015

(54) MULTI-COMPOSITION DIELECTRIC FOR SEMICONDUCTOR DEVICE

(71) Applicant: Taiwan Semiconductor Manufacturing Company, Ltd., Hsin-Chu (TW)

(72) Inventors: Su-Hao Liu, Chiayi County (TW); Chun-Yi Chang, Bade (TW); Ming-Feng Lin, Hsinchu (TW); Sheng-Wen Yu, New Taipei (TW); Ziwei Fang, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/772,616

(22) Filed: Feb. 21, 2013

(65) Prior Publication Data

US 2014/0235044 A1 Aug. 21, 2014

(51) Int. Cl.
*H01L 29/739* (2006.01)
*H01L 21/02* (2006.01)
*H01L 21/28* (2006.01)

(52) U.S. Cl.
CPC .... *H01L 21/02107* (2013.01); *H01L 21/28008* (2013.01)
USPC ..... 438/199; 438/197; 438/624; 257/E21.575

(58) Field of Classification Search
CPC .............. H01L 21/76; H01L 21/76801; H01L 21/76829; H01L 21/76843; H01L 23/53295; H01L 29/66545
USPC ......... 438/622–624, 778, 783, 786, 787, 791, 438/197, 199, 591; 257/E21.575
See application file for complete search history.

(56) References Cited

U.S. PATENT DOCUMENTS

| | | | |
|---|---|---|---|
| 5,859,458 A | 1/1999 | Hsueh et al. | |
| 6,174,797 B1 | 1/2001 | Bao et al. | |
| 8,294,201 B2 | 10/2012 | Yu et al. | |
| 8,546,209 B1 * | 10/2013 | Cheng et al. | 438/183 |
| 2005/0202616 A1 * | 9/2005 | Liao et al. | 438/197 |
| 2013/0140547 A1 * | 6/2013 | Lee et al. | 257/40 |

* cited by examiner

*Primary Examiner* — Thanhha Pham
(74) *Attorney, Agent, or Firm* — Haynes and Boone, LLP

(57) ABSTRACT

The present disclosure provides a method of semiconductor device fabrication including forming a multi-composition ILD layer by forming a first portion of an inter-layer dielectric (ILD) layer on a semiconductor substrate; and forming a second portion of an ILD layer on the first portion of the ILD layer. The second portion may have a greater silicon content than the first portion. For example, the second portion may be a silicon rich oxide.

20 Claims, 7 Drawing Sheets

MULTI-COMPOSITION DIELECTRIC FOR SEMICONDUCTOR DEVICE

BACKGROUND

The semiconductor integrated circuit (IC) industry has experienced rapid growth. In the course of IC evolution, functional density has generally increased while feature size has decreased. This scaling down process generally provides benefits by increasing production efficiency and lowering associated costs. However, the rapid growth also presents challenges in maintaining and improving performance of the devices. One method used by the industry to meet the performance demands for semiconductor devices is the adoption metal gate electrodes. One method of forming metal gate electrodes adopted by the industry is that of the gate-last or replacement gate methodology. The replacement gate architecture provides benefits such as improved work function material stability, increased ability to tune the work function metal to the device type (e.g., PMOS, NMOS), and decreased exposure of the gate electrode to high temperature processing.

However, the replacement gate methodology also presents challenges as it typically includes additional process modules such as chemical mechanical polishing (CMP) and the processing required to strip out a dummy gate that the metal gate electrode replaces. These process modules can expose the surrounding features to additional stresses. For example, the interlayer dielectric (ILD) that provides isolation between gate features can be attacked by the CMP and dummy gate removal processes causing unwanted loss of the dielectric.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Figure 1:
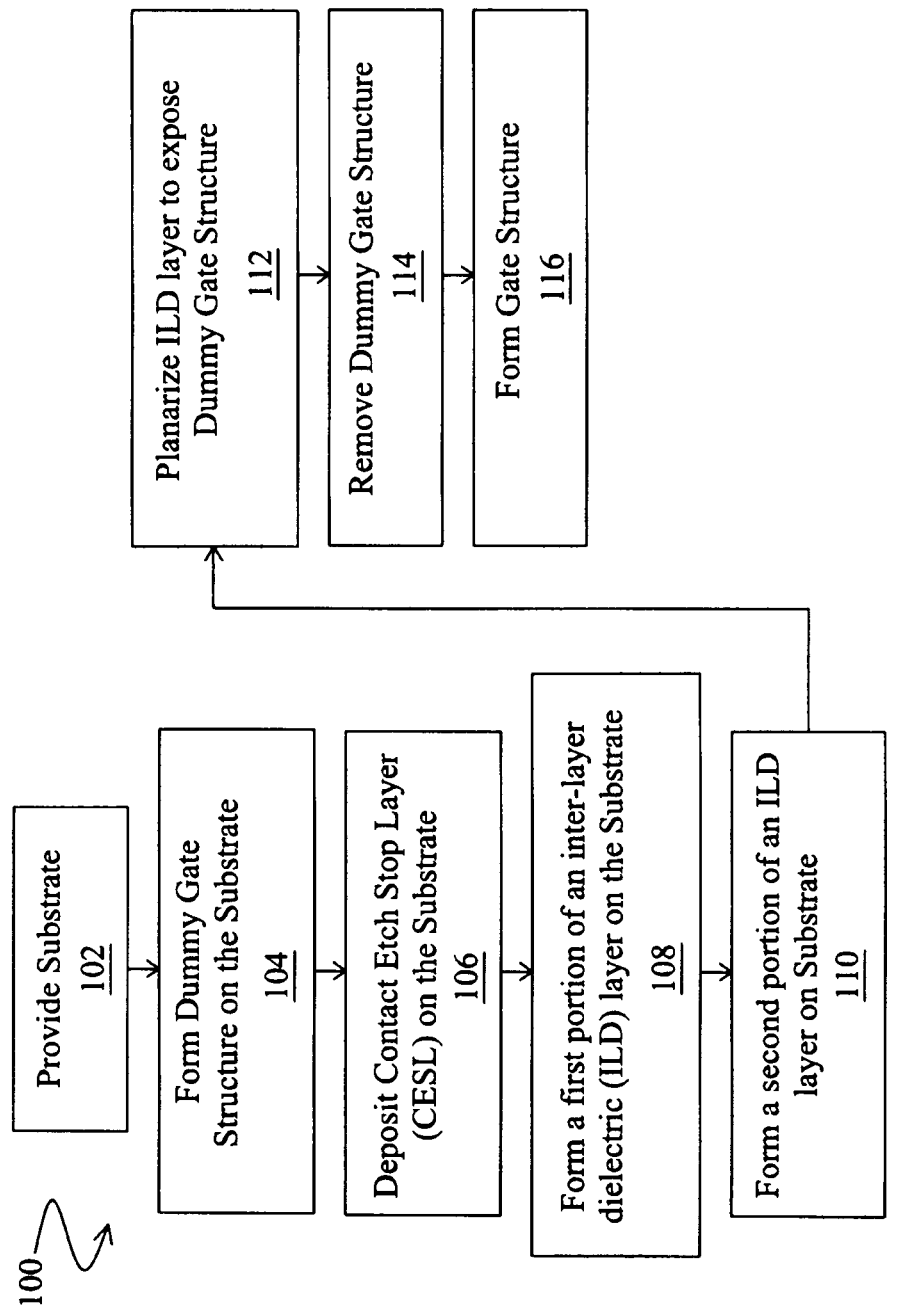
FIG. 1 is a flow chart of an embodiment of a method of fabricating a semiconductor device including a dielectric layer according to one or more aspects of the present disclosure.

Illustrated in FIG. 1 is a method of semiconductor device fabrication including forming a multi-composition or multi-region dielectric layer. In an embodiment, the formed dielectric layer is an inter-layer dielectric (ILD) layer, for example, disposed on a substrate to provide isolation between one or more features such as gate structures, contacts, interconnect lines and vias, and/or other suitable features. Figures of the present disclosure may be directed to an ILD layer formed between gate structures of a substrate, typically referred to as ILD0. The ILD0 may serve to provide isolation between contact elements to one or more features (e.g., gate, source, drain) formed on the substrate. However, one of ordinary skill in the art will appreciate other dielectric layers, including other ILD layers such as those of a multi-layer interconnect (MLI) structure may also benefit from the present disclosure. (An MLI structure may provide a structure having two or more horizontal layers having conductive traces connected by vertically extending conductive vias or plugs. An MLI structure may connect one or more features of a semiconductor device such as, for example, a bond pad with a transistor gate, source or drain.) FIGS. 2, 3, 4, 5, 6, and 7 are cross-sectional views of an exemplary semiconductor device or portion thereof fabricated according to one or more steps of the method 100 of FIG. 1.

It is also to be understood that a gate-last or replacement gate methodology is described herein as an exemplary embodiment, which is not intended to be limiting except as explicitly recited in the claims.

The method 100 begins at block 102 where a substrate is provided. The substrate includes a semiconductor substrate. In an embodiment, the semiconductor substrate includes silicon. Alternatively, the substrate includes germanium or silicon germanium. In other embodiments, the substrate may use another substrate material such as, for example, diamond, silicon carbide, gallium arsenic, GaAsP, AlInAs, AlGaAs, GaInP, combinations thereof, and/or other suitable semiconductor materials. The substrate may include various features such as, strained regions, silicon-on-insulator (SOI) technology, epitaxially-grown layers, and/or other suitable features. Referring to the example of FIG. 2, a semiconductor substrate 202 is provided.

The semiconductor substrate also includes various doped regions such as n-wells and p-wells formed by a suitable technique such as ion implantation, diffusion, anneals, and/or other suitable processes. In one embodiment, the substrate includes a plurality of isolation features, such as shallow trench isolation (STI) to define various regions for making image sensors, various transistors, and other functional features. The shallow trench isolation features may be formed by a suitable technique. For example, the STI features may be formed by a set of processes including patterning the semiconductor layer by a conventional photolithography, etching the semiconductor layer by a plasma etching process to form various trenches, and filling the trenches by a dielectric material such as silicon oxide by a chemical vapor deposition (CVD) process. Referring to the example of FIG. 2, an exemplary isolation feature (STI) 204 is illustrated. In an embodiment, the STI 204 interposes regions of the substrate each including a different type of device, for example, an nFET region and a pFET region.

The method 100 then proceeds to block 104 where a dummy gate structure is formed on the substrate. The dummy gate structure may include various layers such as, interface layer(s), dielectric layer(s), dummy gate electrode layer(s), capping layer(s), and/or other suitable layers. One or more of the layers of the dummy gate structure are sacrificial. Referring to the example of FIG. 2, a dummy gate structure 206 is disposed on the substrate 202. The dummy gate structure 206 may include any plurality of layers including, for example, IL, gate dielectric layer(s), and gate electrode layer(s). In an embodiment, each of the layers of the dummy gate structure is sacrificial. In another embodiment, one or more of the layers may remain on the final device (e.g., a gate dielectric) while an overlying layer is sacrificial (e.g., gate electrode). In an embodiment, the dummy gate structure 206 may include a polysilicon layer formed on a dielectric layer. The polysilicon layer may be formed by a proper technique such as CVD. Patterning the layers of the dummy gate structure can be performed in various manners, such as by using a patterned mask, followed by an etch process.

After the formation of the dummy gate structures, source and drain regions are formed in and/or on the semiconductor substrate. The source/drain regions may be formed by suitable processes such as, ion implantation of p-type dopant (such as boron) or n-type (such as phosphorous). In an embodiment, the source/drain regions include epitaxially-grown regions. In one embodiment, the source and drain include light doped drain (LDD) features and heavily doped source and drain (S/D) features. In one embodiment, the gate stack is configured in the active region for an n-type field effect transistor (nFET), and the dopant of the source and drain is n-type dopant, such as phosphorus or arsenic. In another embodiment, the gate stack is configured in the active region for a p-type field effect transistor (pFET), and the dopant of the source and drain is p-type dopant, such as boron or gallium.

Figure 2:
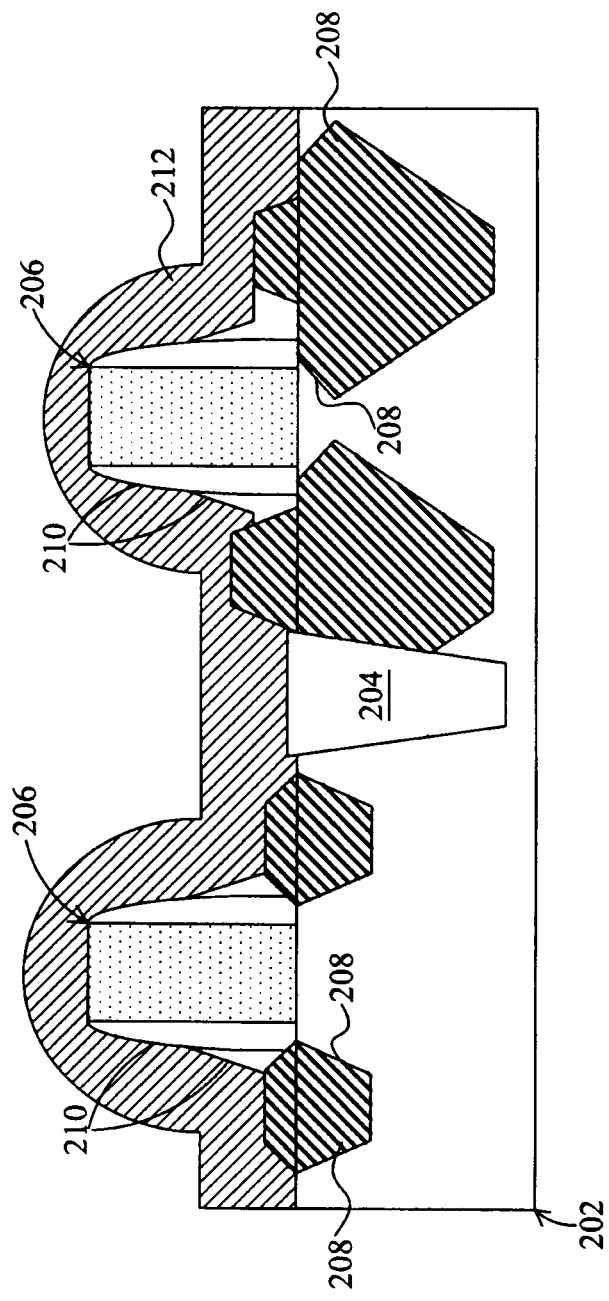
FIGS. 2-7 illustrate cross-sectional views of an embodiment of a semiconductor device fabricated according to one or more steps of the method of FIG. 1.

Referring to the example of FIG. 2, source/drain features 208 are formed on the substrate 202. In the present embodiment, spacer elements 210 are formed on the sidewalls of the dummy gate structure 206. The spacer elements 210 may include one or more dielectric materials, such as silicon oxide, silicon nitride, silicon oxynitride or combinations thereof. The spacer elements 210 may serve to define the walls of the trench formed by the removal of the dummy gate structure 206 (described below), define the source/drain regions 208 including the LDD regions and/or other suitable functions. In one embodiment, the LDD features are formed by one ion implantation; the gate spacers are formed on the sidewalls of the gate structure; then heavily doped S/D features are formed by another ion implantation. A thermal annealing process may follow for activation.

The method 100 then proceeds to block 106 where a contact etch stop layer (CESL) is formed on the substrate. Referring to the example of FIG. 2, a CESL 212 is formed over the substrate 202, for example, by a deposition process (such as chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plating, other suitable methods, or combinations thereof. The CESL may include a dielectric material, such as silicon oxide, silicon nitride, silicon oxynitride, combinations thereof, and/or other suitable materials.

The method 100 then proceeds to block 108 where a first portion of an ILD layer is formed on the substrate. The first portion of the ILD layer is formed over the substrate, for example, by a deposition process (such as chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), other suitable methods, or combinations thereof. The first portion of the ILD layer may include a multilayer structure having multiple dielectric materials. In an embodiment, the first portion of the ILD layer is $SiO_2$. Other exemplary compositions include silicon nitride, silicon oxynitride, TEOS formed oxide, phosphosilicate glass (PSG), borophosphosilicate glass (BPSG), low-k dielectric materials, other suitable dielectric materials, and/or combinations thereof. Exemplary low-k dielectric materials include fluorinated silica glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, other proper materials, and/or combinations thereof.

Figure 3:
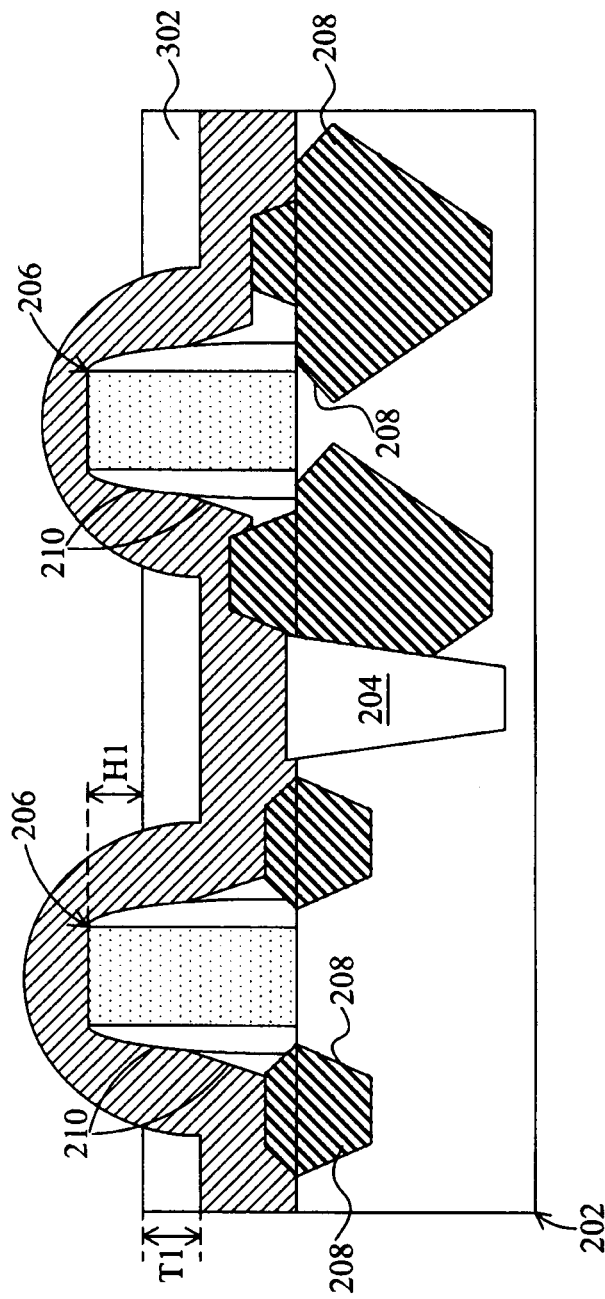

Referring to the example of FIG. 3, a first portion 302 of an ILD layer is disposed on the substrate 202. In an embodiment, the first portion 302 is silicon oxide. However, other compositions are possible including those described above. In an embodiment, the first portion 302 of the ILD layer is formed by PE-CVD. However, other deposition methods are possible including those described above.

In an embodiment, the first portion 302 does not extend to a top surface of the dummy gate structure 206. For example, a top surface of the first portion 302 of the ILD layer lies a distance H1 from the top surface of the dummy gate structure 206. In an embodiment, H1 is between approximately 5 nanometers and approximately 60 nanometers, by way of example. The first portion 302 has a thickness T1. In an embodiment, the thickness T1 is between approximately 30 and 60 nm, by way of example. In one embodiment, the thickness T1 is approximately 45 nm. The thickness T1 may be dependent upon the gate height and the isolation desired between the adjacent features (e.g., gate structures). In an embodiment, the first portion 302 of the ILD layer is formed by PE-CVD.

The method 100 then proceeds to block 110 where a second portion of the ILD layer is formed on the substrate. The second portion of the ILD layer may be the top portion or region of the ILD layer (e.g., the ILD being a sum of the first and second portions). The second portion of the ILD layer may be formed directly on the first portion of the ILD layer. In an embodiment, the second portion of the ILD layer is formed in-situ with the first portion of the ILD layer. For example, the second portion may be formed within the same fabrication tool and/or chamber as the first portion. In another embodiment, the second portion of the ILD layer is formed ex-situ (i.e., not in-situ) with the first portion of the ILD layer. Ex-situ processing includes deposition in a different tool or chamber.

The second portion of the ILD layer differs in composition from the first portion of the ILD layer. Specifically, the second portion of the ILD layer includes a composition having a different removal rate from that of the first portion. The removal rate may be determined by chemical mechanical polish, wet etch, and/or dry etch process. The second portion of the ILD layer may have a removal rate (polishing rate, etch rate) that is less than (e.g., retarded from) that of the first portion of the ILD layer.

In an embodiment, the second portion of the ILD layer includes a silicon-rich composition. In one embodiment, the second portion of the ILD layer includes a silicon-rich silicon oxide composition. For example, a typical silicon oxide used in semiconductor fabrication has a $SiO_2$ phase. A silicon-rich oxide composition may include $SiO_x$, where x is less than 2. For example, in an embodiment, x may be between approximately 1 and approximately 1.6. In one embodiment, x may be between approximately 1.5 and 1.6.

In an embodiment, the second portion of the ILD layer also or alternatively includes $SiC_xN_yO_z$. In one embodiment, the second portion of the ILD layer also or alternatively includes silicon nitride. In a further embodiment, the second portion of the ILD layer includes a silicon-rich silicon nitride composition. For example, a typical silicon nitride used in semiconductor fabrication has a $Si_3N_4$ phase, a silicon-rich nitride composition may include $Si_xN_4$, where x is greater than approximately 3. In an embodiment, the second portion of the ILD layer is silicon, however other issues may make this composition less desirable for certain aspects (e.g., isolation and/or processing issues). In an embodiment, the second portion of the ILD layer is a combination of the above compositions.

Figure 4:
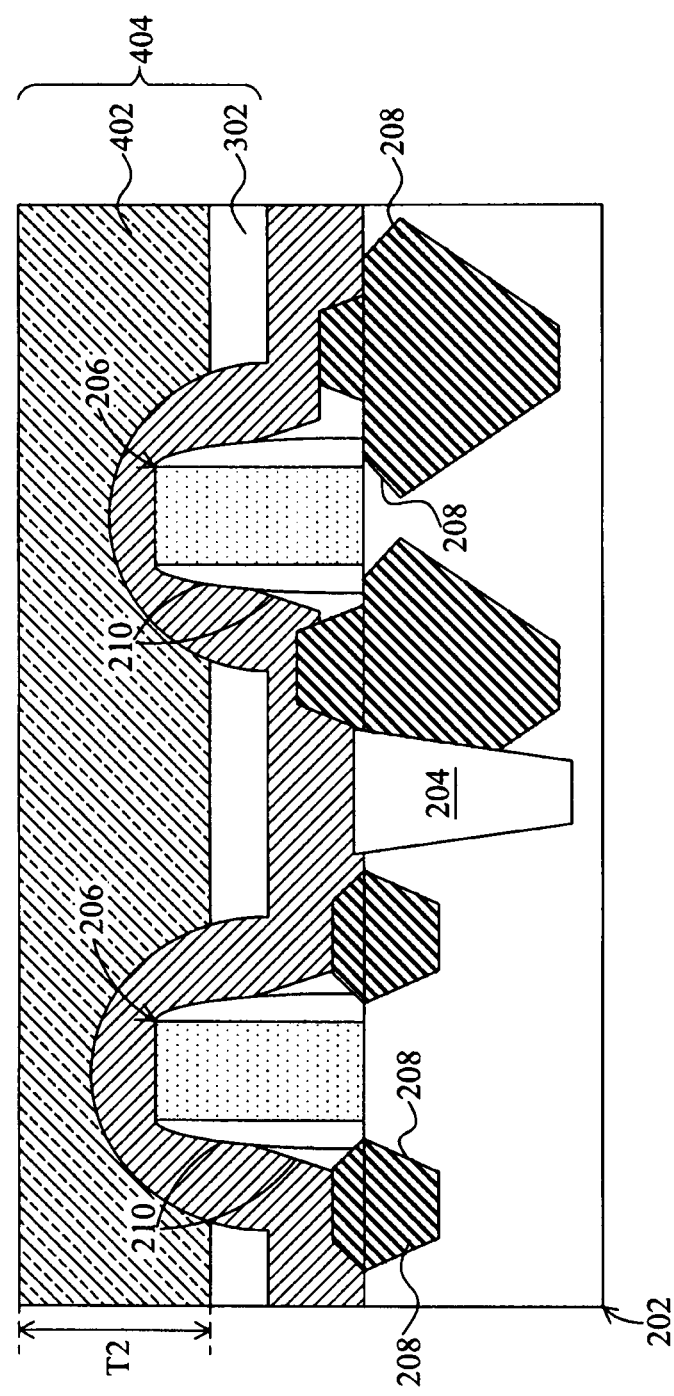
Figure 5:
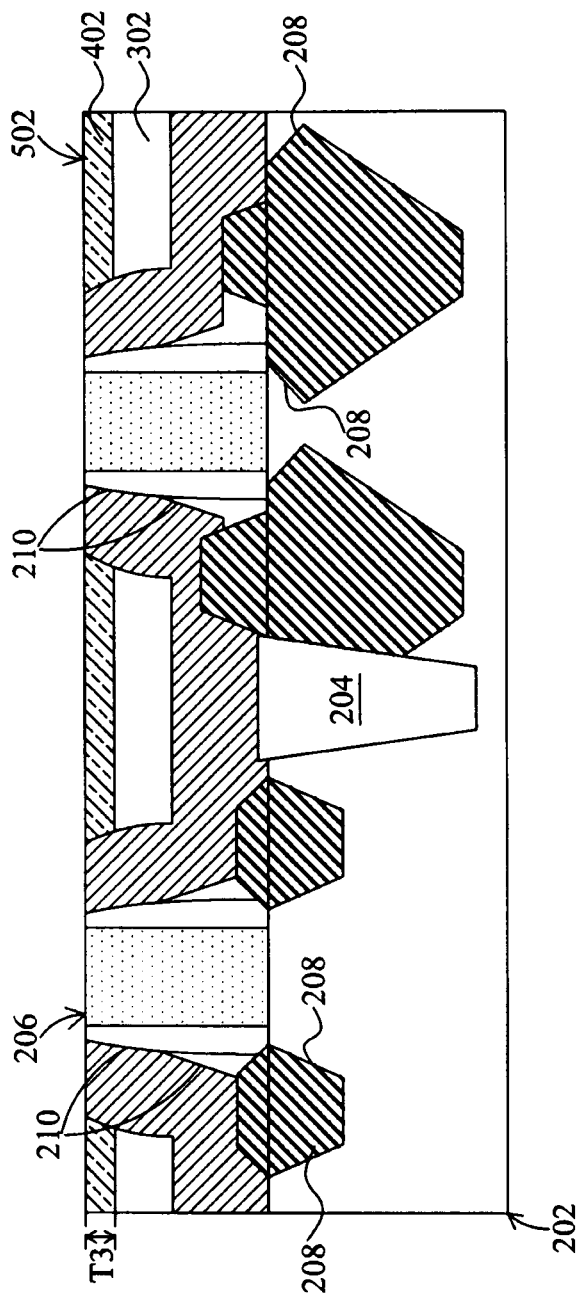

Referring to the example of FIG. 4, a second portion 402 of the ILD layer is formed on the first portion 302 of the ILD layer. The second portion of the ILD layer 402 has a thickness T2. In an embodiment, the thickness T2 is between approximately 45 nm and approximately 360 nm. The thickness T2 may be determined by characterization of the process and semiconductor device such that a sufficient thickness of the second portion of the ILD layer remains after subsequent processing such as CMP, wet etch, dry etch processes, while maintaining a sufficient isolation between adjacent features of the semiconductor device. The first portion 302 and the second portion 402 form an ILDO layer 404.

As described above, the first and second portions of the ILD layer may be formed in situ. In an embodiment, the first and second portions of the ILD layer are formed in-situ using CVD process (e.g., PE-CVD). In another embodiment, the first and second portions are formed ex-situ, for example, using a CVD process (e.g., PE-CVD) in a different tool and/or chamber. In an embodiment, the first portion of the ILD layer is formed using a precursor of $O_2:SiH_4$ at a ratio of approximately 2.2. In an embodiment, the second portion of the ILD layer is formed using a precursor of $O_2:SiH_4$ at a ratio of between 1 and 2 (e.g., 1.5, 1.6). In an embodiment, the second portion of the ILD layer is formed using a precursor of $O_2:SiH_4$ at a ratio of less than or equal to 1. These compositions are by way of example only and not intended to be limiting when not explicitly provided for in the claims.

The method 100 then proceeds to block 112 where the ILD layer may be planarized. The planarization may expose a top surface of the dummy gate structure. In an embodiment, the planarization includes a chemical mechanical polish (CMP) process. Referring to the example of FIG. 5, a planarized surface 502 is illustrated that exposes a top surface of the dummy gate structure 206. The second portion of the ILD layer 402 has been thinned to a thickness T3. T3 is less than T2 of FIG. 4. In an embodiment, T3 may be between approximately 7 nm and approximately 10 nm. However, other values of T3 may be provided such that sufficient protection of the first region of the ILD layer is provided for subsequent processing such as the etching processes to remove the dummy gate structure described below.

The method 100 then proceeds to block 114 where the exposed dummy gate structure is removed (e.g., stripped) from the substrate. The dummy gate structure, or portions thereof, may be removed using suitable wet etch and/or dry etching processing. The removal of the dummy gate structure results in a trench (within which a replacement gate may be formed.) The removal may include an etch that is selective to the material of the dummy gate structure. In one embodiment, the gate replacement process further includes a cleaning process after the etch process. During the etch process to remove the dummy gate and/or cleaning processes, material loss may occur to the exposed ILD layer.

Figure 6:
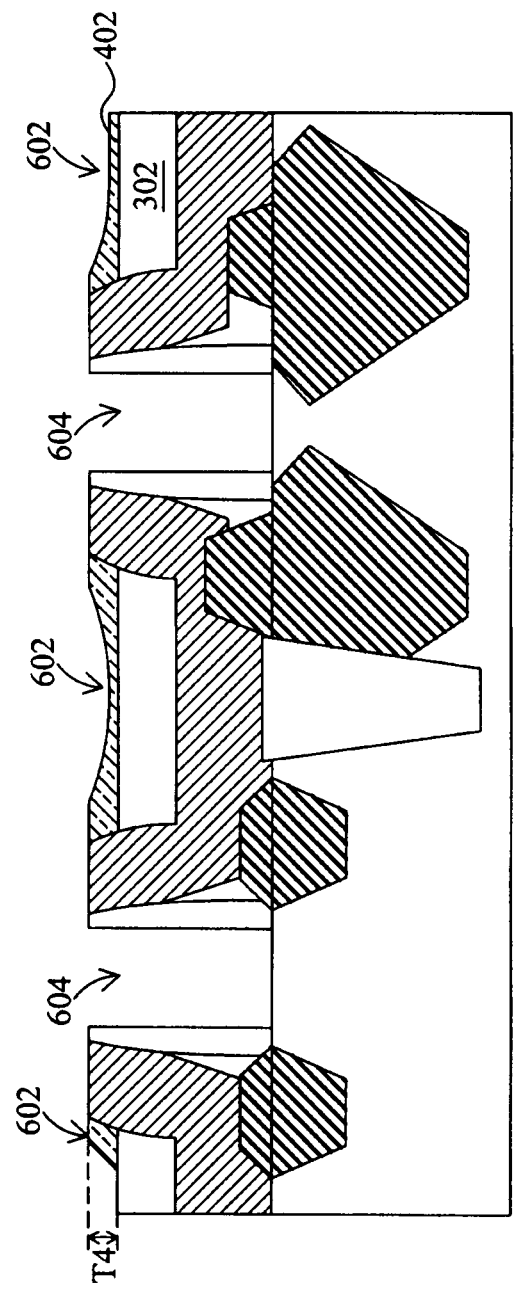

Referring to the example of FIG. 6, the dummy gate structure 206 is selectively removed by an etch process, resulting in a gate trench 604. The removal of the dummy gate structure may include removal of a dummy gate electrode layer, a dummy gate dielectric layer, an interface layer, and/or other suitable layers. During the removal of the dummy gate structure 206, the second portion 402 of the ILD layer incurs additional material loss illustrated as regions 602. It is noted that this material loss however provides a barrier for the undesired loss of the first portion of the ILD layer 302. In an embodiment, the second portion of the ILD layer 402 has been thinned to a thickness T4. T4 is less than T3 of FIG. 5. In an embodiment, T4 may be between approximately 1 nm. However, other values of T4 may be provided such that sufficient protection of the first region of the ILD layer is provided. Thus, in an embodiment, the first region of the ILD layer remains at a substantially constant thickness before, during and after the replacement gate process (e.g., the first portion is not removed by planarization, dummy gate structure removal, etc).

The method 100 then proceeds to block 116 where a gate structure is formed in the trench provided by the removal of the dummy gate structure. In an embodiment, the gate structure includes a gate dielectric and a metal gate electrode. In one embodiment, the gate electrode material includes a metal material chosen to have a proper work function for the corresponding FET, such as nFET or pFET, also referred to as n work function metal (or n metal) or p metal, respectively. For example, the gate electrode may include any metal material suitable for forming a work function layer such as, TiN, TaN, ZrN, HfN, VN, NbN, CrN, MoN, WN, TiAl, TiAlN, combinations thereof, and/or other suitable metals. The gate electrode may be formed by ALD, physical vapor deposition (PVD or sputtering), chemical vapor deposition (CVD), or other suitable processes.

In an embodiment, the gate structure includes a gate dielectric material. In one embodiment, the gate dielectric material includes a high-k dielectric material. The high-k dielectric material includes a dielectric material having the dielectric constant higher than that of thermal silicon oxide, which is about 3.9. In one example, the high-k dielectric material includes hafnium oxide (HfO). In various examples, the high-k dielectric material includes metal oxide, metal nitride, or combinations thereof. In one example, the gate dielectric material may be formed by CVD, atomic layer deposition (ALD), plasma enhanced CVD (PECVD), plasma enhanced ALD (PEALD), and/or other suitable processes.

The gate structure may also include an interfacial layer (IL). In one example, the interfacial layer includes silicon oxide formed by a suitable technique, such as thermal oxidation. The interfacial layer may be formed by other technique, such as ALD or CVD. In one example, it may be formed by a wet process, such as chemical oxide. The gate structure formed in the trench may further include other suitable layers such as, for example, capping layer(s).

In an alternative embodiment of a gate-last or gate-first replacement gate (RPG) process, the "dummy" gate structure may not be completely replaced. For example, the gate dielectric material or interface layer in the original (dummy) gate stack is not removed and replaced.

Figure 7:
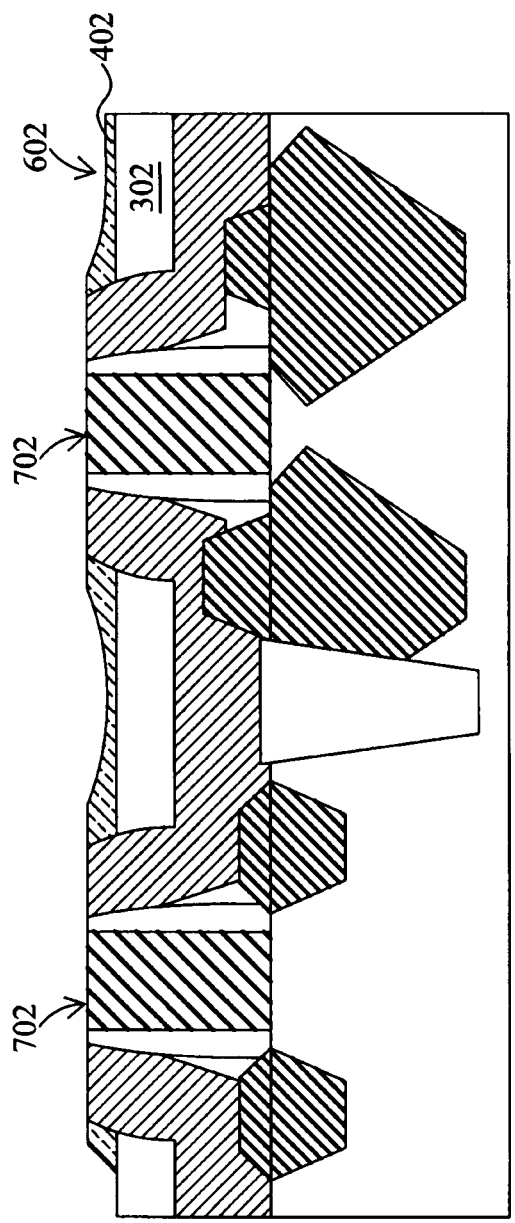

Referring to the example of FIG. 7, a gate structure 702 is formed in the trench 604. The gate structure 702 may include an IL, a gate dielectric layer, a work function layer, and/or other suitable layers including as described above. In an embodiment, the gate structure 702 includes a gate electrode composition tuned for one of a pFET or nFET.

The method 100 may proceed such that other circuit features, such as contacts, may be further formed. For example, a multi-layer interconnect (MLI) structure and dielectric layers separating the MLI structure are formed and configured with proper connections to form designed circuit. The MLI structure includes various contacts, vias and metal lines. In one embodiment, the MLI may include conductive materials such as aluminum, aluminum/silicon/copper alloy, titanium, titanium nitride, tungsten, polysilicon, metal silicide, or combinations, referred to as aluminum interconnects. Aluminum interconnects may be formed by a process including physical vapor deposition (or sputtering), chemical vapor deposition (CVD), or combinations thereof. In embodiments, a copper multilayer interconnect may be used and include copper, copper alloy, titanium, titanium nitride, tantalum, tantalum nitride, tungsten, polysilicon, metal silicide, or combinations. The copper multilayer interconnect may be formed by a technique such as CVD, sputtering, plating, or other suitable processes.

In summary, the methods and devices disclosed herein provide for forming a multi-region or composition dielectric layer, such as an ILD layer having a plurality of portions or regions with differing compositions. In doing so, embodiments of the present disclosure offer several advantages over prior art devices. For example, homogenous dielectric layers may suffer from unwanted loss of material during the dummy gate structure removal process including the CMP process, such as described above with reference to block 112, and/or the stripping process such as described above with reference to block 114. Embodiments of the present disclosure provide for reduction or minimization of loss of the ILD material during subsequent planarization, wet etch, and/or dry etch processing. In an embodiment, the etch rate of the top portion of the ILD layer effectively reduces the etch rate of the material during one or more of these processes. Meanwhile, embodiments of the multi-region dielectric layer provide advantages such as sufficient isolation between elements on the substrate. It is understood that different embodiments disclosed herein offer different disclosure, and that they may make various changes, substitutions and alterations herein without departing from the spirit and scope of the present disclosure. As but one example, some of the embodiments disclosed herein are directed to ILD0 layer. However, other dielectric layers, including other ILD layers, may benefit from the present disclosure. For example, any dielectric layer faced with subsequent planarization, wet etching, dry etching processes may benefit from the formation of a protective upper region having a lower etch rate and/or resistance to a planarization process.

Thus, in one embodiment described herein a method of semiconductor device fabrication is provided that includes forming a first portion of an inter-layer dielectric (ILD) layer on a semiconductor substrate; and forming a second portion of an ILD layer on the first portion of the ILD layer. The second portion has a greater silicon content than the first portion.

In one embodiment, forming the first portion of the ILD layer and forming the second portion of the ILD layer are performed in-situ. Other embodiments form the portions of the ILD layer ex-situ. In an embodiment, the first portion of the ILD layer includes a silicon dioxide layer. In an embodiment, the second portion of the ILD layer includes a silicon-rich silicon dioxide layer, for example, a composition of $SiO_x$, where x is less than 2. The silicon-rich silicon dioxide layer may be formed directly on a silicon oxide layer (e.g., the first portion of the ILD layer).

In embodiments, a dummy gate structure is formed prior to the first portion of the ILD layer and the first portion of the ILD layer is formed adjacent the dummy gate structure. A top surface of the first portion of the ILD layer may lie below a top surface of the dummy gate structure.

In another of the embodiments of a method of semiconductor device fabrication described herein a dummy gate structure is formed on a substrate. A dielectric layer is formed around and on the dummy gate structure. The dielectric layer includes a first layer (silicon oxide) and a second layer, formed in-situ with the first layer, which includes a silicon-rich oxide material. In another embodiment, the dielectric layer includes a first layer (silicon oxide) and a second layer, formed ex-situ with the first layer, which includes a silicon-rich oxide material.

In one embodiment, forming the first and second layers is performed in a chemical vapor deposition (CVD) chamber. In an embodiment, the second layer includes forming a layer of SiOx, where x is less than 2. For example, the layer of SiOx, may have an "x" between approximately 1.5 and approximately 1.6.

In some embodiments, after forming the dielectric layer, the dummy gate structure is removed. Removing the dummy gate structure may remove a portion of the second layer of the dielectric layer.

In some embodiments, after forming the dielectric layer, the dielectric layer is planarized to expose a top surface of the dummy gate electrode. The planarizing may remove the second layer of the dielectric layer and not the first layer of the dielectric layer.

In another of the embodiments of a method of semiconductor device fabrication, described herein a dummy gate structure is formed on a substrate and a dielectric layer is formed around and on the dummy gate structure. The dielectric layer includes forming a first dielectric layer; and forming a second dielectric layer on the first layer and in-situ with the first layer. Other embodiments include ex-situ formation of the first and second dielectric layers. The second layer includes at least one of a silicon-rich oxide, SiCNO, SiN, and combinations thereof.

In one embodiment, the first dielectric layer includes forming a layer having a composition having a differing removal rate (e.g., CMP, etching removal rate) from that of the second dielectric layer. In one embodiment, the second dielectric layer may be between approximately 45 nanometers (nm) and approximately 360 nm in thickness.

In one embodiment, the dummy gate structure is removed after forming the dielectric layer, and removing the dummy gate structure removes a portion of the second dielectric layer. In an embodiment, forming the first dielectric layer includes a precursor ratio of $O_2:SiH_4$ of 2.2 and the forming the second dielectric layer includes a precursor ration of $O_2:SiH_4$ of less than or equal to approximately 1, for example, in a CVD chamber.

What is claimed is:

1. A method of semiconductor device fabrication, comprising:
   forming a dummy gate structure on a semiconductor substrate;
   forming a first portion of an inter-layer dielectric (ILD) layer on semiconductor substrate adjacent the dummy gate structure; and
   forming a second portion of the ILD layer on the first portion of the ILD layer, wherein the second portion has a greater silicon content than the first portion;
   after forming the first and second portions of the ILD layer, removing the dummy gate structure, wherein the removing at least partially removes the second portion of the ILD layer.

2. The method of claim 1, wherein the forming the first portion of the ILD layer and the forming the second portion of the ILD layer are performed in-situ.

3. The method of claim 1, wherein the forming the first portion of the ILD layer includes forming a silicon dioxide layer.

4. The method of claim 3, wherein the forming the second portion of the ILD layer includes forming a silicon-rich silicon dioxide layer.

5. The method of claim 1, wherein the forming the second portion of the ILD layer includes forming a silicon-rich silicon dioxide layer.

6. The method of claim 5, wherein the silicon-rich silicon dioxide layer is formed directly on a silicon oxide layer.

7. The method of claim 1, wherein a top surface of the first portion of the ILD layer lies below a top surface of the dummy gate structure.

8. The method of claim 1, wherein the forming the first portion of the ILD layer and the forming the second portion of the ILD layer are performed ex-situ.

9. A method of semiconductor device fabrication, comprising:
    forming a dummy gate structure on a substrate;
    forming a dielectric layer around and on the dummy gate structure, wherein the forming the dielectric layer includes:
        forming a first layer, wherein the first layer includes silicon oxide; and
        forming a second layer on the first layer, wherein the second layer is a silicon-rich oxide material; and
    after forming the dielectric layer, planarizing the dielectric layer to expose a top surface of the dummy gate electrode, wherein the planarizing removes a portion of the second layer of the dielectric layer and not the first layer of the dielectric layer.

10. The method of claim 9, wherein the forming the first and second layers are performed in-situ in a chemical vapor deposition (CVD) chamber.

11. The method of claim 9, wherein the forming the second layer includes forming a layer of SiOx, where x is less than 2.

12. The method of claim 9, wherein the forming the second layer includes forming a layer of SiOx, where x is between approximately 1.5 and approximately 1.6.

13. The method of claim 9, further comprising:
    after forming the dielectric layer, removing the dummy gate structure including performing the planarizing.

14. The method of claim 13, wherein the removing the dummy gate structure removes a portion of the second layer of the dielectric layer.

15. The method of claim 9, wherein the forming the first and second layers are performed ex-situ in a chemical vapor deposition (CVD) chamber.

16. The method of claim 9, wherein the planarizing provides a top surface of the second dielectric layer below the top surface of the dummy gate electrode.

17. A method of semiconductor device fabrication, comprising:
    forming a dummy gate structure on a substrate;
    forming a multi-region dielectric layer around and on the dummy gate structure, wherein the forming the multi-region dielectric layer includes:
        forming a first dielectric layer; and
        forming a second dielectric layer on the first layer, wherein the second layer includes at least one of a silicon-rich oxide, SiCNO, SiN, and combinations thereof; and
    removing the dummy gate structure after forming the multi-region dielectric layer, wherein the removing the dummy gate structure removes a portion of the second dielectric layer.

18. The method of claim 17, wherein the forming the first dielectric layer includes forming a layer having a composition with a differing removal rate from a composition of the second dielectric layer.

19. The method of claim 17, wherein the forming the second dielectric layer includes forming a thickness between approximately 45 nanometers (nm) and approximately 360 nm.

20. The method of claim 17, wherein the forming the first dielectric layer includes a precursor ratio of $O_2$:$SiH_4$ of 2.2 and wherein the forming the second dielectric layer includes a precursor ratio of $O_2$:$SiH_4$ of less than or equal to approximately 1.

* * * * *